United States Patent
Mikhaylich et al.

(10) Patent No.: US 6,537,381 B1
(45) Date of Patent: Mar. 25, 2003

(54) METHOD FOR CLEANING AND TREATING A SEMICONDUCTOR WAFER AFTER CHEMICAL MECHANICAL POLISHING

(75) Inventors: Katrina A. Mikhaylich, San Jose, CA (US); Mike Ravkin, Sunnyvale, CA (US)

(73) Assignee: Lam Research Corporation, Fremont, CA (US)

( * ) Notice: Subject to any disclaimer, the term of this patent is extended or adjusted under 35 U.S.C. 154(b) by 10 days.

(21) Appl. No.: 09/408,281

(22) Filed: Sep. 29, 1999

(51) Int. Cl.⁷ ................................................ B08B 7/04
(52) U.S. Cl. ................................ 134/6; 134/2; 134/26; 134/29; 134/36; 134/42; 134/902; 15/77; 15/88.2; 15/88.3; 510/175; 510/254; 510/367; 510/372; 510/434; 510/477
(58) Field of Search ........................ 15/77, 88.2, 88.3; 510/175, 367, 372, 254, 434, 477; 134/2, 6, 26, 29, 36, 42, 902

(56) References Cited

U.S. PATENT DOCUMENTS

| | | | |
|---|---|---|---|
| 3,779,842 A | * 12/1973 | Grunwald et al. ............ 156/18 |
| 4,395,302 A | * 7/1983 | Courduvelis ................ 156/642 |
| 4,578,162 A | * 3/1986 | McIntyre et al. ............ 204/107 |
| 5,129,955 A | 7/1992 | Tanaka ......................... 134/2 |
| 5,328,561 A | * 7/1994 | Letize et al. ................. 156/666 |
| 5,466,389 A | * 11/1995 | Ilardi et al. ................... 252/156 |
| 5,478,436 A | 12/1995 | Winebarger et al. ..... 156/636.1 |
| 5,498,293 A | * 3/1996 | Ilardi et al. ...................... 134/3 |
| 5,637,151 A | * 6/1997 | Schulz ........................... 134/2 |
| 5,806,126 A | * 9/1998 | de Larios et al. ............. 15/102 |
| 5,858,109 A | * 1/1999 | Hymes et al. .................. 134/2 |
| 5,868,863 A | * 2/1999 | Hymes et al. ................. 134/28 |
| 5,911,835 A | * 6/1999 | Lee et al. ..................... 134/1.3 |
| 5,981,454 A | * 11/1999 | Small ........................... 510/175 |
| 6,093,254 A | * 7/2000 | Svirchevski et al. ........... 134/2 |

FOREIGN PATENT DOCUMENTS

| | | | |
|---|---|---|---|
| DE | WO 98/06127 | 12/1998 | ......... H01L/21/306 |
| EP | 63-4617 | 9/1988 | ......... H01L/21/304 |
| EP | 812011 A2 | 10/1997 | ......... H01L/21/306 |
| FR | 95 08510 | 7/1995 | ............ C23G/1/14 |
| JP | 07166373 | * 6/1995 | |
| WO | WO 97/13590 | 4/1997 | .......... B08B/11/00 |
| WO | WO 99/46353 | 9/1999 | ........... C09K/13/00 |

OTHER PUBLICATIONS

Elbel, Wang, Sanger, Hadawi and Held, "*Copper Post–CMP Brush Cleaning*", 1999 EEE Siemens AG, 81739 Munich, Germany, Cabot Corp., Aurora, IL 60504.

* cited by examiner

Primary Examiner—Sharidan Carrillo
(74) Attorney, Agent, or Firm—Martine & Penilla, LLP

(57) ABSTRACT

A method is provided for cleaning a surface of a semiconductor wafer after a CMP operation. In one example, an improved cleaning chemical (ICC) is applied to the surface of the wafer. The ICC is configured to transform a copper film on the surface of the wafer into a water soluble form. The wafer surface is scrubbed. The wafer is then rinsed with a liquid. The scrubbing and the rinsing are configured to remove a controlled amount of the water soluble copper from the surface of the wafer and the brush, wherein the applying, the scrubbing, and the rinsing are performed in a brush box.

15 Claims, 8 Drawing Sheets

US 6,537,381 B1

METHOD FOR CLEANING AND TREATING A SEMICONDUCTOR WAFER AFTER CHEMICAL MECHANICAL POLISHING

BACKGROUND OF THE INVENTION

1. Field of the Invention

The present invention relates generally to semiconductor wafer cleaning and, more particularly, to post chemical mechanical polishing (CMP) copper cleaning.

2. Description of the Related Art

In the fabrication of semiconductor devices, there is a need to perform chemical mechanical polishing (CMP) operations and wafer cleaning. Typically, integrated circuit devices are in the form of multi-level structures. At the substrate level, transistor devices having diffusion regions are formed. In subsequent levels, interconnect metallization lines are patterned and electrically connected to the transistor devices to define the desired functional device. As is well known, patterned conductive layers are insulated from other conductive layers by dielectric materials, such as silicon dioxide. As more metallization levels and associated dielectric layers are formed, the need to planarize the dielectric material grows. Without planarization, fabrication of further metallization layers becomes substantially more difficult due to the higher variations in the surface topography. In other applications, metallization line patterns are formed in the dielectric material, and then, metal CMP operations are performed to remove excess metallization. After any such CMP operation, it is necessary that the planarized wafer be cleaned to remove particulates and contaminants.

FIG. 1A shows a cross-sectional view of a wafer having a copper layer 104 deposited over the top surface of the wafer. An oxide layer 100 is deposited over a semiconductor substrate (not shown). Well-known photolithography and etching techniques may be used to form patterned features in the oxide layer 100. Next, the top surface of the wafer is coated with a copper layer 104 and the patterned features are thereby filled with copper to form copper lines 102.

FIG. 1B shows a cross-sectional view of the wafer of FIG. 1A after the top surface has undergone a chemical mechanical polishing (CMP) operation. The top surface is polished until the top surface is planar and the oxide layer 100 is exposed.

Unfortunately, the CMP operation is likely to leave imperfections on the surface of the wafer. For example, the CMP operation may leave micro-scratches on the surface of the copper metallization features and on the surface of the silicon dioxide layer. These micro-scratches are likely to contain embedded slurry and trace amounts of copper material on the silicon dioxide layer from the CMP operation. FIG. 1B demonstrates how the CMP operation leaves a rough copper oxide layer 110 over the top surface of the copper line 102. It is believed that the roughness in the copper oxide layer is primarily due to copper from the metallization features that is left on the surface of the wafer after the CMP operation.

FIG. 1C shows a cross-sectional view of the wafer of FIG. 1B after a metal via has been formed to make contact with the copper line 102. A second oxide layer 101 is deposited over the polished top surface of the wafer. Well-known photolithography and etching techniques may be used to form conductive vias 122. The vias are filled with a barrier layer 120, such as tantalum nitride (TaN), which provides adhesion between the conductive via 122 and the copper line 102.

Unfortunately, the rough copper oxide layer 110 caused by the CMP operation may cause processing flaws. The damaged wafer surface, for example, may result in vias that form inadequate bonds to metallization features. In other words, the rough copper oxide layer 110 creates adhesion problems at the contact area between the conductive via 122 and the copper line 102. The adhesive strength at the contact area is diminished where the left over copper from the CMP operations interferes with the adhesive bond between the barrier layer 120 and the copper line 102. Thus, the barrier layer 120 will not form an adequately adhesive bond with the copper line 102.

Another fabrication problem created by a typical CMP operation is faulty electrical connections between vias 122 and copper lines 102 caused by the rough copper oxide layer 110. For instance, the rough copper layer 110 may increase the resistance of the connection between the copper lines 102 and the conductive vias 122 to an unacceptably high level. A resistance that is too high for one via connection will cause an entire semiconductor device to be inoperable or produce slower devices. As can be appreciated, the fabrication process becomes very costly when a multitude of devices must be discarded due to faulty electrical connections between vias and copper lines.

In view of the foregoing, there is a need for a cleaning process that avoids the problems of the prior art by implementing wafer cleaning and associated fabrication techniques that provide for better connections between copper lines and conductive vias.

SUMMARY OF THE INVENTION

Broadly speaking, the present invention fills these needs by providing a method for cleaning and treating a wafer after a chemical mechanical polishing (CMP) operation. It should be appreciated that the present invention can be implemented in numerous ways, including as a process, an apparatus, a system, a device or a method. Several inventive embodiments of the present invention are described below.

In one embodiment, a method is provided for cleaning a surface of a semiconductor wafer after a CMP operation. An improved cleaning chemical (ICC) is applied to the surface of the wafer. The ICC is configured to transform a small portion of copper film on the surface of the wafer into a water soluble form. The wafer surface is scrubbed. The wafer is then rinsed with a liquid. The rinsing is configured to remove the water soluble copper from the surface of the wafer and the brush, wherein the applying, the scrubbing, and the rinsing can be performed in a brush box or any other brush cleaning apparatus.

In another embodiment, a method is provided for removing surface materials from a wafer after a CMP operation. The wafer is scrubbed with an oxide etching chemical or HF to etch a small amount of silicon dioxide. The wafer is then scrubbed with deionized (DI) water to rinse the oxide etching chemical and/or HF. Next, the wafer is scrubbed with an improved cleaning chemical (ICC) after the scrubbing with the DI water. The wafer is then scrubbed with DI water after the scrubbing with the ICC.

In yet another embodiment, a method of treating a surface of a substrate is disclosed. The method includes: (a) transforming a copper film on the surface of the substrate into a water soluble form; (b) scrubbing the surface of the substrate with a brush; and (c) rinsing the substrate with a liquid, the rinsing being configured to remove post-CMP residues, the ICC, and the water soluble copper from the surface of the substrate and the brush.

Advantageously, the present invention provides a method for cleaning and treating a semiconductor wafer after a CMP operation. The method includes operations for cleaning embedded and left-over copper (Cu) material from a CMP operation. As discussed in the background, left-over copper may cause a decrease in adhesive strength of bonds between metallization features and conductive vias. The methods of the present invention provide techniques for treating the wafer surface so that conductive vias can bond better and stronger with underlying copper lines. A better, stronger bond also provides lower resistive links between copper lines of different layers.

Another advantage of the present invention is the removal of surface corrosion of the copper lines. As the ICC cleans the wafer surface, it also removes unwanted corroded copper. Still another advantage is the prevention of future corrosion of copper lines. By providing a layer of copper oxide over copper features, the method protects the copper features from future corrosion. Note that copper oxide ($CuO_x$) is far less susceptible to corrosion than pure copper (Cu) lines. Additionally, the brush life can be extended since the cleaning techniques, and particularly the use of the ICC, also remove copper and other residues from the brushes during normal cleaning, treating, or etching. Ultimately, the methods disclosed herein will substantially reduce undue costs in the overall fabrication process because the number of damaged wafers that must be discarded will be substantially reduced.

Other aspects and advantages of the present invention will become apparent from the following detailed description, taken in conjunction with the accompanying drawings, illustrating by way of example the principles of the present invention.

BRIEF DESCRIPTION OF THE DRAWINGS

The present invention will be readily understood by the following detailed description in conjunction with the accompanying drawings, in which like reference numerals designate like structural elements.

DETAILED DESCRIPTION OF THE PREFERRED EMBODIMENTS

An invention for methods for cleaning a surface of a semiconductor wafer after chemical mechanical polishing (CMP) with the use of an improved cleaning chemical (ICC) is disclosed. In the following description, numerous specific details are set forth in order to provide a thorough understanding of the present invention. It will be understood, however, to one skilled in the art, that the present invention may be practiced without some or all of these specific details. In other instances, well known process operations have not been described in detail in order not to unnecessarily obscure the present invention.

Figure 1A:
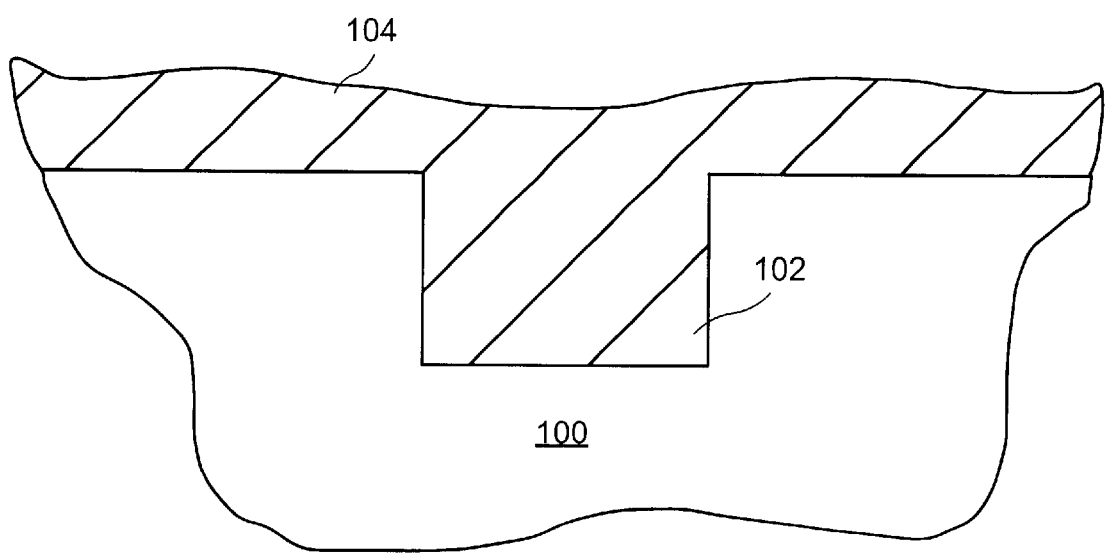
FIG. 1A shows a cross-sectional view of a prior art wafer having a copper layer deposited over the top surface of the wafer.
Figure 1B:
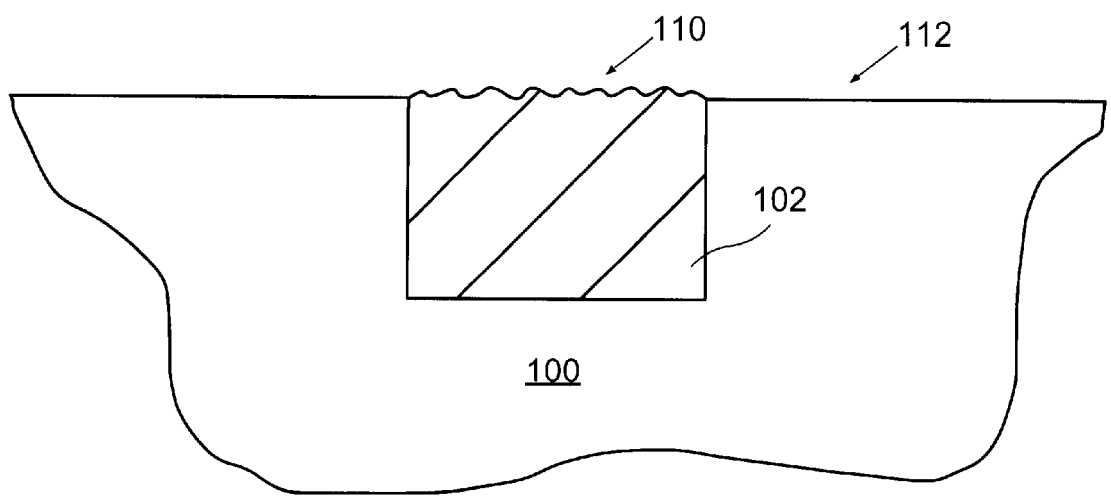
FIG. 1B shows a cross-sectional view of the prior art wafer of FIG. 1A after the top surface has undergone a chemical mechanical polishing (CMP) operation.
Figure 1C:
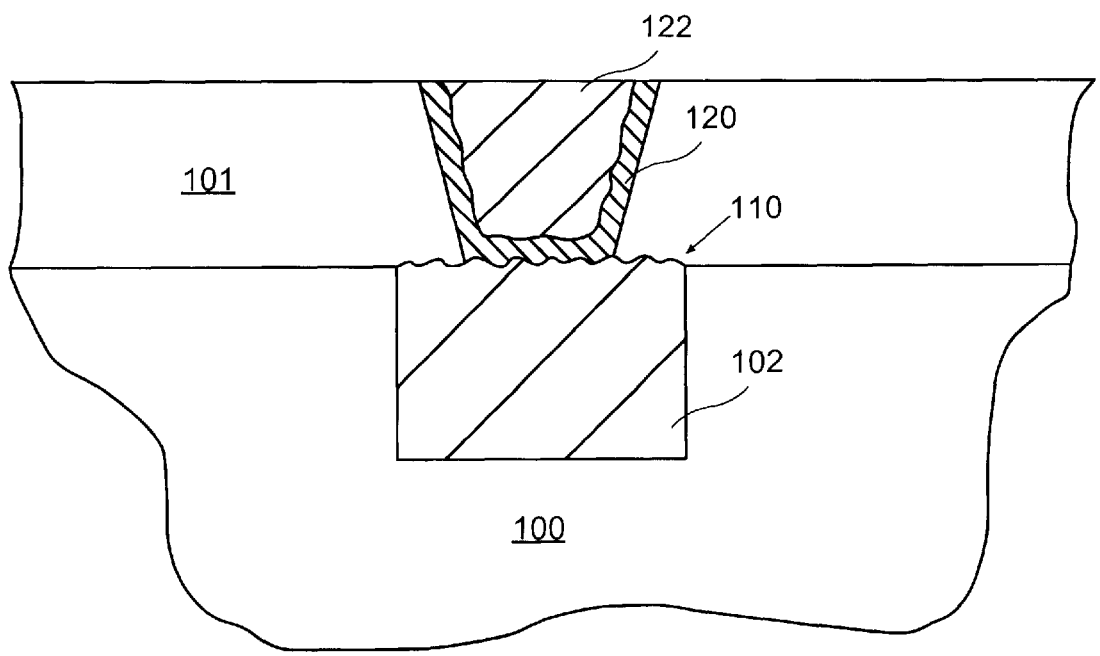
FIG. 1C shows a cross-sectional view of the prior art wafer of FIG. 1B after a metal via has been formed to make contact with the copper line.
Figure 2:
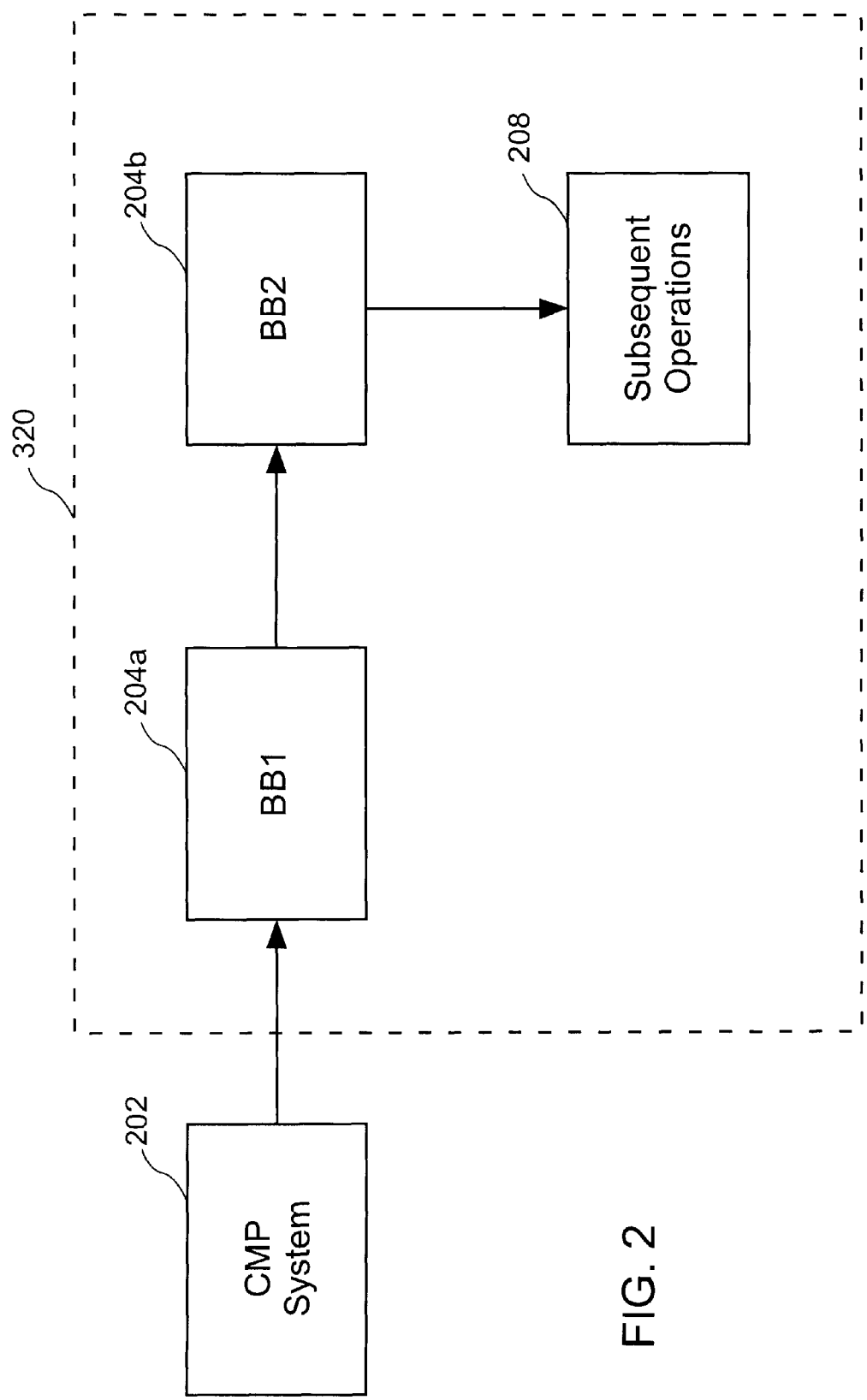
FIG. 2 shows a high-level schematic diagram of a chemical mechanical polishing (CMP) system, and a wafer cleaning system, in accordance with one embodiment of the present invention.

FIG. 2 shows a high-level schematic diagram of a chemical mechanical polishing (CMP) system 202, and a wafer cleaning system 320, in accordance with one embodiment of the present invention. After a semiconductor wafer undergoes a CMP operation in the CMP system 202, the wafer is cleaned in a wafer cleaning system 320.

The wafer cleaning system 320 contains a first brush box 204a and a second brush 204b. The wafer enters the first brush box 204a, where cleaning operations, such as brush scrubbing and rinsing, may be performed on the wafer. The wafer may then proceed to the second brush box 204b where additional cleaning operations may be performed on the wafer. Alternatively, after cleaning operations in the first brush box 204a, the wafer may proceed directly to subsequent operations 208, such as spin, rinse, and dry. After the cleaning operations, the wafer proceeds to other post-CMP processing operations, where the wafer may undergo additional fabrication operations, including additional deposition of layers, sputtering, photolithography, and associated etching.

Figure 3A:
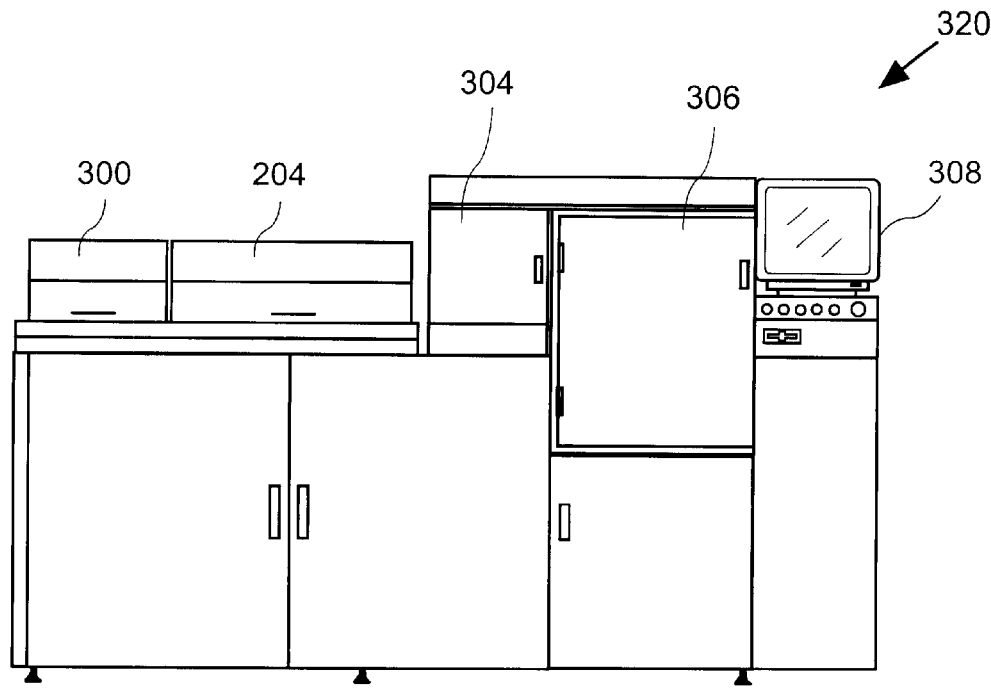
FIGS. 3A and 3B show a more detailed side view and top view, respectively, of the wafer cleaning system of FIG. 2, in accordance with one embodiment of the present invention.
Figure 3B:
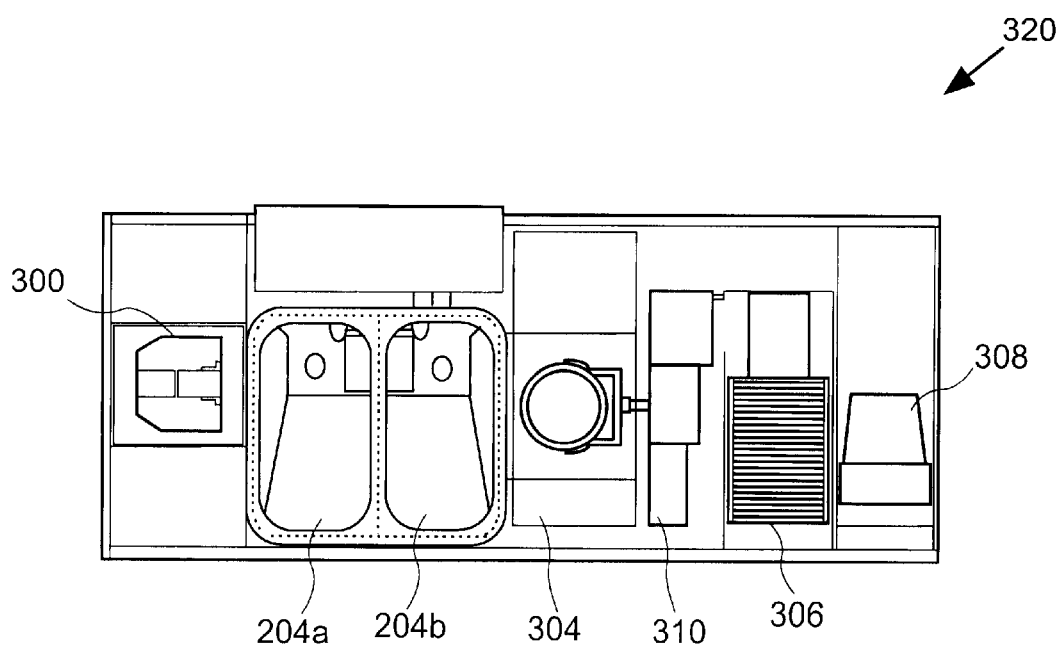

FIGS. 3A and 3B show a more detailed side view and top view, respectively, of the wafer cleaning system 320 of FIG. 2, in accordance with one embodiment of the present invention. The wafer cleaning system 320 typically includes an input station 300 where a plurality of wafers may be inserted for cleaning through the system after the wafers have undergone CMP operations. Once the wafers are inserted into the input station 300, a wafer may be taken from the input station 300 and moved into the brush box 204, which contains a first brush box 204a and a second brush box 204b. Inside the brush box, various cleaning and etching operations may be applied to the wafer. These cleaning and etching operations are discussed in greater detail below with reference to FIGS. 4 and 5.

After brushes have been applied to the wafer in the brush boxes 204, the wafer is moved into a spin, rinse, and dry (SRD) station 304. In the SRD station 304, de-ionized (DI) water is sprayed onto the surface of the wafer while the wafer is spun at a speed of between about 100 and 400 revolutions per minute, and then is spun to dry. After the wafer has been placed through the SRD station 304, an unload handler 310 takes the wafer and moves it into an output station 306. The cleaning system 320 is programmed and controlled from system electronics 308.

Figure 4A:
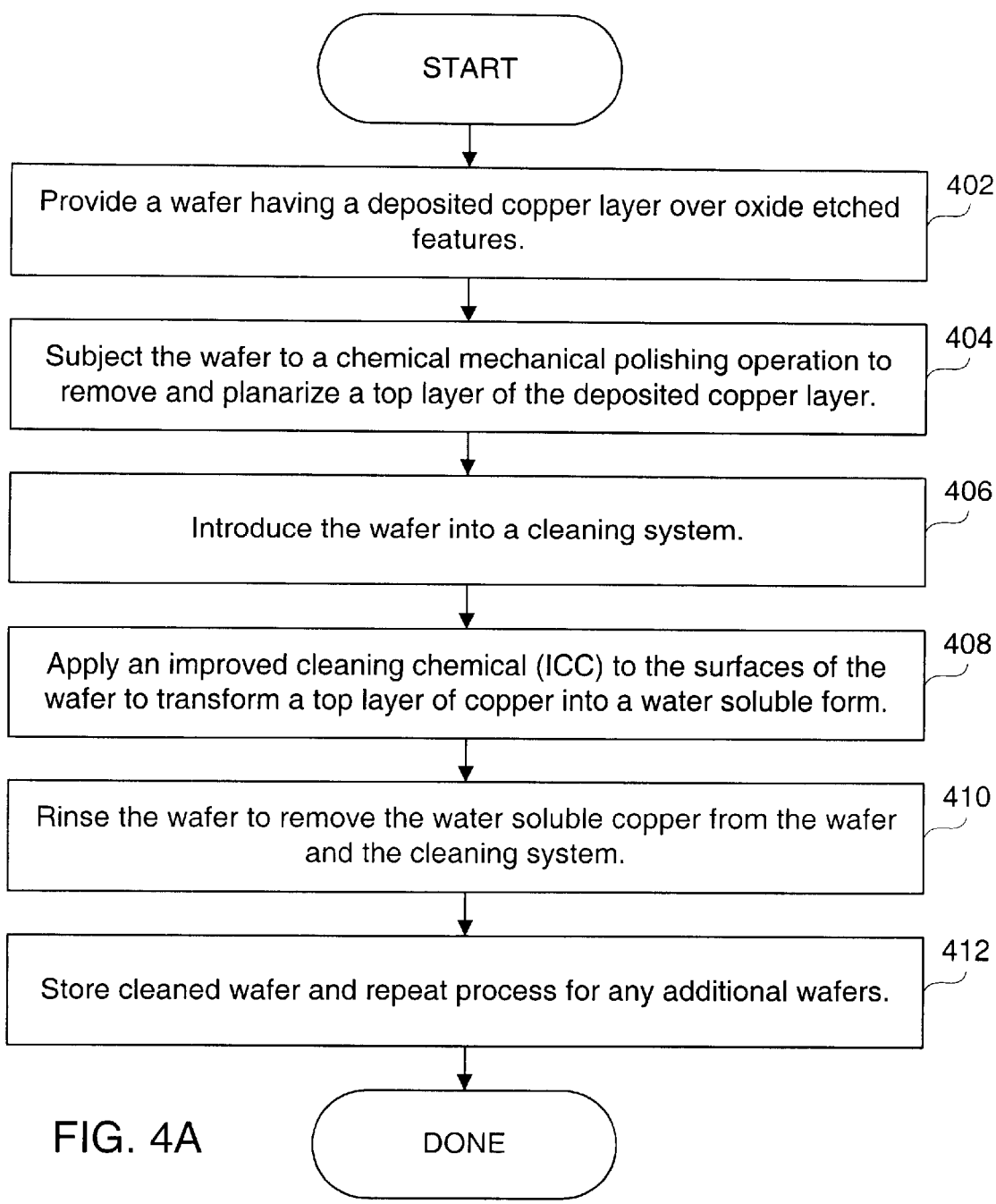
FIG. 4A shows a flowchart of a method of performing cleaning operations on the wafer in a brush box, in accordance with one embodiment of the present invention.

FIG. 4A shows a flowchart of a method of performing cleaning operations on the wafer in a brush box, in accordance with one embodiment of the present invention. The method starts in operation 402 where a wafer is provided that has a deposited copper layer over oxide etched features. At operation 404, the wafer is then subjected to a CMP operation to remove and planarize a top layer of the deposited copper layer.

As discussed above, the CMP operation is likely to cause imperfections to the surface of the wafer in such a way that vias may potentially form inadequate bonds to metallization features. The methods of FIGS. 4 and 5 are examples of methods for treating the surface of the wafer to prevent such a fabrication flaw.

Continuing the discussion of FIG. 4A, after the CMP operation of 404, the wafer is introduced to a cleaning system in operation 406. Then in operation 408, an improved cleaning chemical (ICC) is applied to the surfaces of the wafer to transform a top layer of copper into a water soluble form. The ICC may also be used to facilitate the removal of post-CMP residues, such as slurry particles, from the surface of the wafer. The copper material is transformed into a water soluble form in order to remove a controlled amount of copper from the surface of the wafer. During the application of the ICC, the ICC also causes oxidation of the top layer of copper to form copper oxide ($CuO_x$). Thus, the ICC includes an oxidizing agent. A strong chelating agent in the ICC, in combination with a weak chelating agent and an oxidizing agent allows the programming of a controlled amount of copper to be removed from the surface of the wafer. In one embodiment, by controlling the amount oxidizing agent that is applied by way of the ICC, the amount of copper oxide left on the surface of the wafer can be more precisely controlled. An example of a chelating agent is ethelenediamine tetraacetic acid (EDTA). An alternative to EDTA can be, for example, oxalic acid.

The ICC solution preferably contains $NH_4OH$, EDTA, $H_2O_2$, and deionized (DI) water. The preferred purpose of the $NH_4OH$ component is to act as a weak chelating agent. The preferred purpose of the EDTA component is to act as a strong chelating agent. The preferred purpose of the $H_2O_2$ component is to act as an oxidizing agent. The DI water component makes up the balance of the solution.

The composition of $NH_4OH$ in the ICC solution is preferably between about 0.035 weight percent and about 0.21 weight percent, more preferably between about 0.05 weight percent and about 1.0 weight percent, and most preferably about 0.01 weight percent. The composition of EDTA is preferably between about 0.005 weight percent and about 0.03 weight percent, more preferably between about 0.0075 weight percent and about 0.02 weight percent, and most preferably about 0.01 weight percent. The $H_2O_2$ composition is contained in the solution in a ratio relative to the DI water composition. This ratio of $H_2O_2$ to DI water by volume is preferably between about 1:30 and about 1:200, more preferably between about 1:50 and about 1:70, and most preferably about 1:120.

Thus, the most preferred ICC solution contains $NH_4OH$ in about 0.07 weight percent, EDTA in about 0.01 weight percent, and a volumetric ratio of $H_2O_2$ to DI water of about 1:120. Such a solution composition removes between about 100 angstroms and about 150 angstroms of copper oxide from the surface of the wafer as the brushes make contact with the wafer surface for a predetermined period of time. In other words, the solution transforms the copper layer to copper oxide, turns the top layer into a water soluble form, and the water soluble form is rinsed away in operation 410, as discussed below.

The time of brush contact with the surface of the wafer is preferably between about 20 seconds and about 50 seconds, more preferably between about 30 seconds and about 40 seconds, and most preferably about 35 seconds. When the time of brush contact is about 35 seconds, about 100 angstroms of copper oxide is removed from the surface of the wafer.

After applying the ICC, the method moves to operation 410 where the wafer is rinsed with DI water to remove the water soluble copper and copper oxide from the wafer surface and the cleaning system (i.e., the brushes). The method preferably leaves between about 5 angstroms and about 30 angstroms of copper oxide on the top surface of the wafer, and most preferably about 10 angstroms of copper oxide. Some copper oxide over the copper surface is advantageous in that it protects the underlying copper from corrosion. After the top surface is rinsed, the method may undergo a spin, rinse, and dry (SRD) operation and then proceed to operation 412 where the cleaned wafer is stored. The foregoing process may be repeated for any additional wafers. The method of this embodiment can be performed in any cleaning system, whether or not the cleaning system uses a brush box or other type of cleaning apparatus.

Figure 4B:
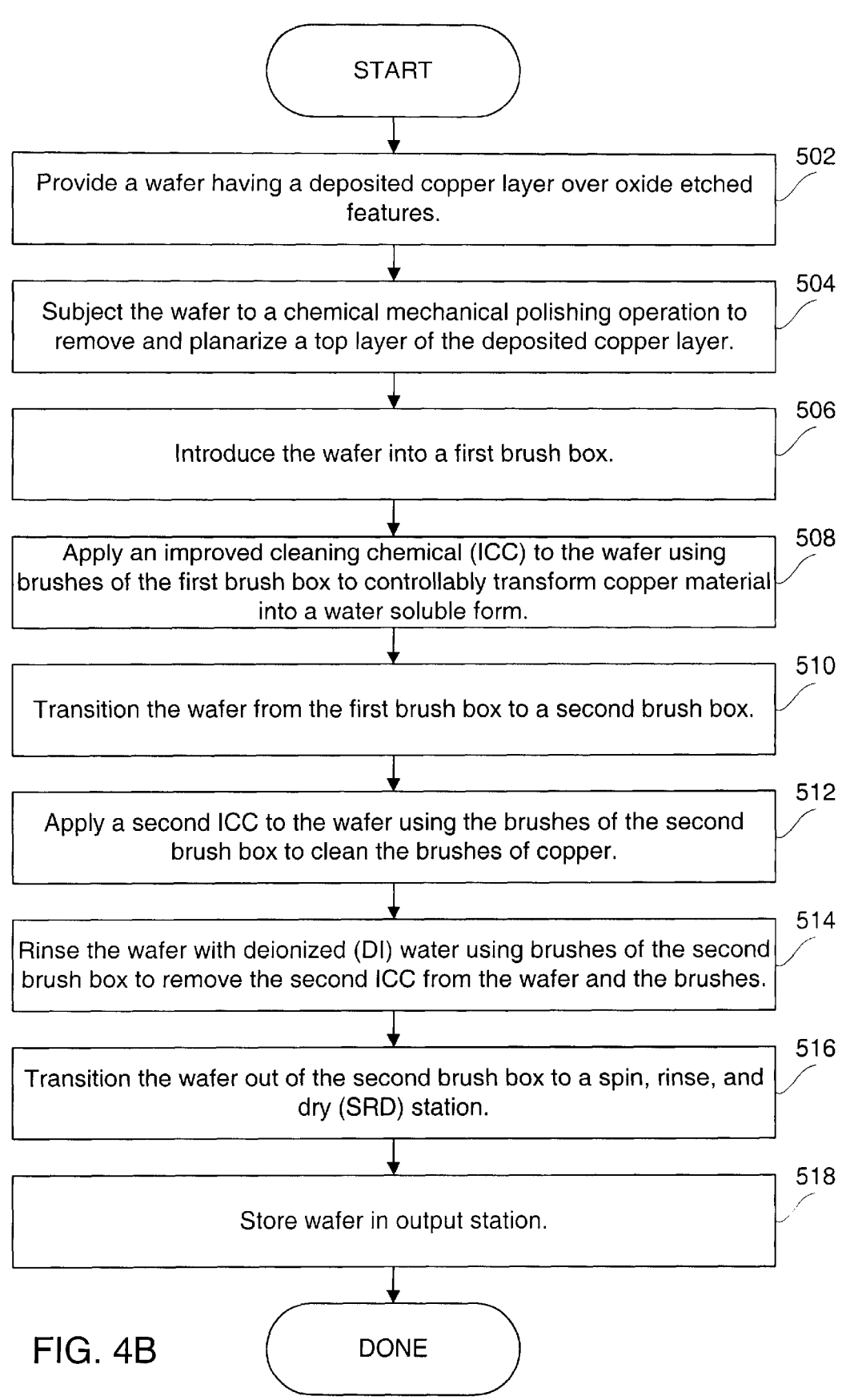
FIG. 4B shows a flowchart of a method of performing cleaning operations on the wafer using two brush boxes, in accordance with one embodiment of the present invention.
Figure 5:
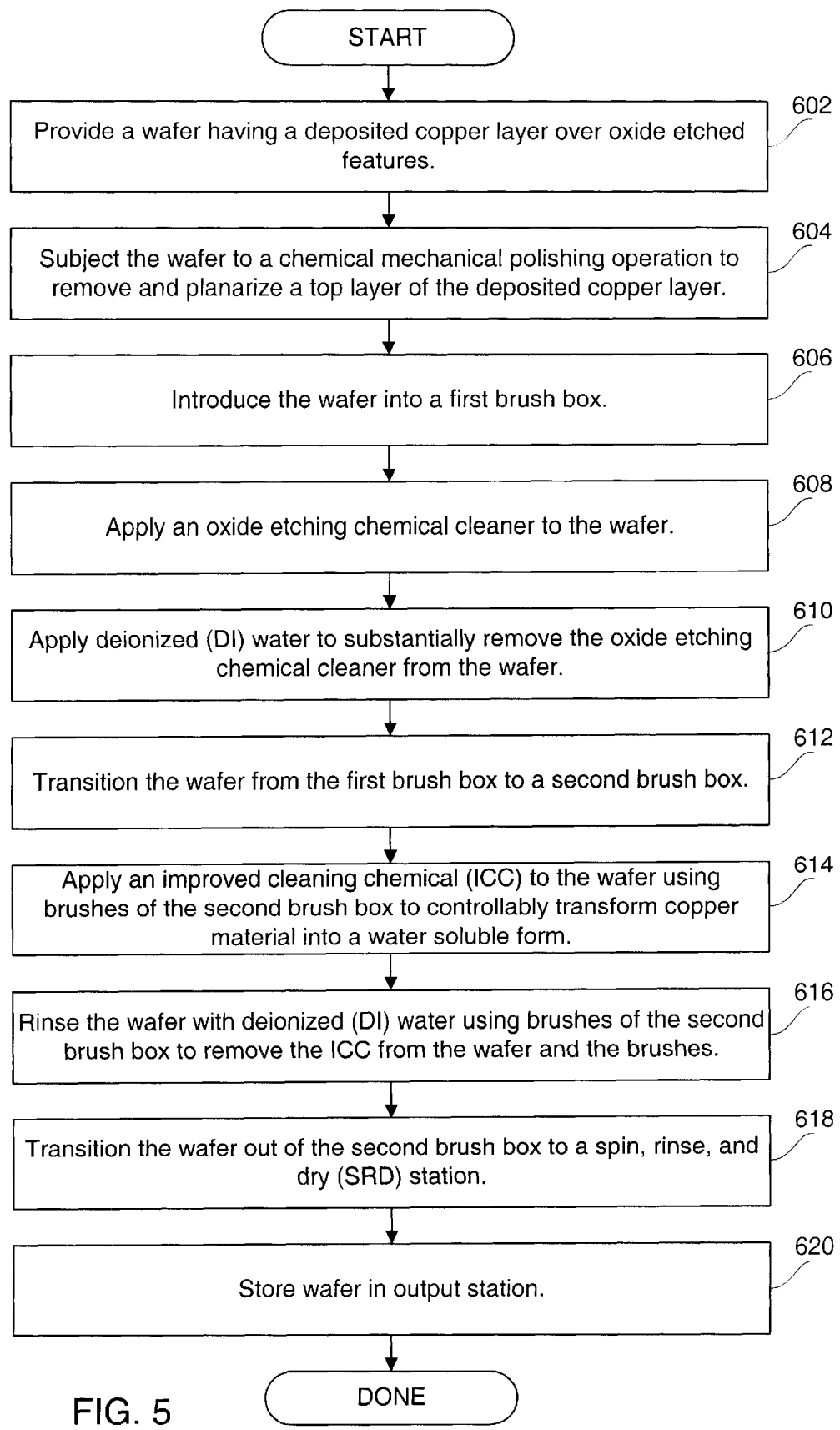
FIG. 5 shows a flowchart of a method of performing cleaning and etching operations on the wafer using two brush boxes, in accordance with one embodiment of the present invention.

FIG. 4B shows a flowchart of a method of performing cleaning operations on the wafer using two brush boxes, in accordance with one embodiment of the present invention. The preferred purpose of the first brush is to clean the silicon dioxide layer and remove a controlled amount of the copper layer. It should be noted that the removal of copper oxide is actually more than just cleaning trace amounts of copper, but the actual removal of copper material. The preferred purpose of the second brush box is to clean the surface of the wafer while cleaning the brushes in the second brush box.

The method starts in operation 502 where a wafer is provided that has a deposited copper layer over oxide etched features. In operation 504, the wafer is then subjected to a CMP operation to remove and planarize a top layer of the deposited copper layer. The method then moves to the cleaning station to perform post-CMP operations to treat the surface of the wafer in order to prevent subsequent processing flaws, which were discussed above.

Accordingly, in operation 506, the wafer is introduced into a first brush box of the cleaning system. In the first brush box, the method moves to operation 508 where an ICC is applied to the wafer using brushes of the first brush box to controllably transform copper material into a water soluble form. The copper material is transformed into a water soluble form in order to remove a controlled amount of copper from the surface of the wafer. The techniques for removing the copper are discussed above with reference to operation 408 of FIG. 4A.

Next, in operation 510, the wafer is preferably transitioned from the first brush box to the second brush box. In the second brush box, the method moves to operation 512 where a second ICC is applied to the surface of the wafer using brushes of the second brush box in order to clean the wafer surface and clean the brushes of copper. The second ICC may contain the same chemical composition as the ICC in the first brush box. Regardless of the chemical composition, however, the preferred purpose of the second ICC is to clean the brushes of copper and other materials that may have been cleaned from the wafer surface. The second ICC is preferably applied for between about 3 seconds and about 10 seconds.

The method then proceeds to operation 514 where the wafer is rinsed with deionized (DI) water using brushes of the second brush box to remove the second ICC from the wafer surface and the brushes. The wafer surface is rinsed preferably for between about 20 seconds and about 40 seconds.

After the operations in the second brush box, the method moves to operation 516 where the wafer is transferred to a spin, rinse, and dry (SRD) station. In operation 518, the wafer may then be stored in an output station.

FIG. 5 shows a flowchart of a method of performing cleaning and etching operations on the wafer using two brush boxes, in accordance with one embodiment of the present invention. The preferred purpose of the first brush is to etch a controlled amount of oxide from the wafer surface. The preferred purpose of the second brush box is to remove a controlled amount of copper from the wafer surface and clean the wafer surface while cleaning the brushes in the second brush box.

The method starts in operation 602 where a wafer is provided that has a deposited copper layer over oxide etched features. In operation 604, the wafer is then subjected to a CMP operation to remove and planarize a top layer of the deposited copper layer. The method then moves to the cleaning station to perform post-CMP operations to treat the surface of the wafer in order to prevent subsequent processing flaws, which were discussed above.

Accordingly, in operation 606, the wafer is introduced into a first brush box of the cleaning system. Next, in operation 608, an oxide etching chemical cleaner is applied to the surface of the wafer. The oxide etching chemical cleaner can also etch silicon oxide. Examples of an oxide etching chemical cleaner are hydrofluoric acid (HF) and mixed copper clean (MCC), which contains hydrofluoric acid. For additional information on MCC, reference can be made to: (1) U.S. patent application Ser. No. 08/955,393, entitled METHODS AND APPARATUS FOR CLEANING SEMICONDUCTOR SUBSTRATES AFTER POLISHING OF COPPER FILM, and filed on Oct. 21, 1997; and (2) U.S. patent application Ser. No. 09/037,586, entitled METHODS AND APPARATUS FOR CLEANING SEMICONDUCTOR SUBSTRATES AFTER POLISHING OF COPPER FILM, and filed on Mar. 9, 1998. These U.S. patent applications are hereby incorporated by reference. Another example of an oxide etching chemical cleaner is buffered oxide etch (BOE). The wafer surface is scrubbed with the oxide etching chemical cleaner preferably for about 30 seconds.

The method then moves to operation 610 where DI water is applied to the wafer to substantially remove the oxide etching chemical cleaner from the surface of the wafer. The wafer surface is scrubbed with the DI water preferably for about 20 seconds.

The method then proceeds to operation 612 where the wafer is transitioned from the first brush box to a second brush box. In operation 614, an ICC is then applied to the wafer using brushes of the second brush box to controllably transform copper material into a water soluble form. The copper material is transformed into a water soluble form in order to remove a controlled amount of copper from the surface of the wafer. The techniques for removing the copper are discussed above with reference to operation 408 of FIG. 4A. The method then moves to operation 616 where the wafer is rinsed with DI water using brushes of the second brush box to remove the ICC from the wafer and the brushes. The wafer is rinsed preferably for between about 20 seconds and about 40 seconds, and most preferably about 20 seconds.

Next, in operation 618, the wafer is transitioned out of the second brush box to a SRD station. The method then proceeds to operation 620 where the wafer is stored in an output station.

While this invention has been described in terms of several preferred embodiments, it will be appreciated that those skilled in the art upon reading the preceding specifications and studying the drawings will realize various alterations, additions, permutations and equivalents thereof. For example, although specific reference is made to brush boxes, any other brush scrubbing apparatus can benefit from the method teachings of the present invention. Additionally, the cleaning embodiments can be applied to any size wafer, such as, 200 mm, 300 mm, and larger, as well as other sizes and shapes. It is therefore intended that the present invention includes all such alterations, additions, permutations, and equivalents that fall within the true spirit and scope of the invention.

What is claimed is:

1. A method of cleaning a surface of a semiconductor wafer after a chemical mechanical polishing (CMP) operation, comprising the steps of:

applying a cleaning chemical to the surface of the semiconductor wafer, the semiconductor wafer having a copper metallization line and a copper layer, the copper layer disposed over the copper metallization line, the cleaning chemical transforming the copper layer on the surface of the semiconductor wafer into a water soluble copper oxide layer, wherein the cleaning chemical is a solution selected from the group consisting of:
$H_2O_2$+$NH_4OH$+EDTA+deionized (DI) water; and
$H_2O_2$+$NH_4OH$+oxalic acid+DI water;

scrubbing the surface of the semiconductor wafer having the cleaning chemical with a brush to remove between about 100 angstroms and about 150 angstroms of the copper oxide layer from the surface of the semiconductor wafer;

rinsing the semiconductor wafer and the brush with deionized water, to remove the water soluble copper oxide from the surface of the semiconductor wafer and the brush prior to cleaning a second semiconductor wafer, wherein the applying, the scrubbing, and the rinsing steps are performed in a brush box; and leaving the copper oxide layer having a thickness between about 5 angstroms and about 30 angstroms on the surface of the semiconductor wafer.

2. A method of cleaning a surface of a semiconductor wafer after a chemical mechanical polishing (CMP) operation as recited in claim 1, further comprising:

controlling an amount of the copper oxide layer remaining on the surface of the semiconductor wafer by controlling an amount of $H_2O_2$ in the cleaning chemical.

3. A method of cleaning a surface of a semiconductor wafer after a chemical mechanical polishing (CMP) operation as recited in claim 1, further comprising:

during the scrubbing step, removing about 100 angstroms of the copper oxide layer in about 35 seconds.

4. A method of cleaning a surface of a semiconductor wafer after a chemical mechanical polishing (CMP) operation as recited in claim 1, wherein the $NH_4OH$ has a composition in the solution of between about 0.035 weight percent and about 0.21 weight percent.

5. A method of cleaning a surface of a semiconductor wafer after a chemical mechanical polishing (CMP) operation as recited in claim 1, wherein the cleaning chemical is $H_2O_2$+$NH_4OH$+EDTA+deionized (DI) water; the EDTA has a composition in the cleaning chemical of between about 0.005 weight percent and about 0.03 weight percent.

6. A method of cleaning a surface of a semiconductor wafer after a chemical mechanical polishing (CMP) operation as recited in claim 1, further comprising:

providing a $H_2O_2$ to DI water ratio of between about 1:30 and about 1:200 in the cleaning chemical.

7. A method of cleaning a surface of a semiconductor wafer after a chemical mechanical polishing (CMP) operation as recited in claim 1, wherein the cleaning chemical is $H_2O_2$+$NH_4OH$+EDTA+deionized (DI) water; the $NH_4OH$ has a composition in the solution of between about 0.035 weight percent and about 0.21 weight percent, the EDTA has a composition in the solution of between about 0.005 weight percent and about 0.03 weight percent and a $H_2O_2$ to DI water ratio for the cleaning chemical is between about 1:30 and about 1:200.

8. A method of cleaning a surface of a semiconductor wafer after a chemical mechanical polishing (CMP) operation as recited in claim 1, further comprising;

during the scrubbing step, contacting the brush with the semiconductor wafer for a period of time between about 20 seconds and about 50 seconds.

9. A method of cleaning a surface of a semiconductor wafer after a chemical mechanical polishing (CMP) operation as recited in claim 1, the method further comprising the steps of:

positioning the semiconductor wafer in a second brush box;

applying a second cleaning chemical to the surface of the semiconductor wafer;

scrubbing the surface of the semiconductor wafer with a second cleaning chemical using a brush in the second brush box to clean copper from the surface of the semiconductor wafer and the brush in the second brush box; and rinsing the semiconductor wafer with DI water using the brush in the second brush box to clean the surface of the semiconductor wafer and the brush in the second brush box of the second cleaning chemical.

10. A method of cleaning a surface of a semiconductor wafer after a chemical mechanical polishing (CMP) operation as recited in claim 9, wherein the surface of tile semiconductor wafer is scrubbed with the second cleaning chemical for a period of time between about 3 seconds and about 10 seconds.

11. A method of cleaning a surface of a semiconductor wafer after a chemical mechanical polishing (CMP) operation as recited in claim 9, wherein the semiconductor wafer in the second brush box is rinsed for a time of between about 20 seconds and about 40 seconds.

12. A method of treating a surface of a semiconductor wafer, comprising the steps of:

introducing the semiconductor wafer into a first brush box;

transforming a copper layer on the surface of the semiconductor wafer into a water soluble copper oxide layer by applying a cleaning chemical to the surface of the semiconductor wafer, the cleaning chemical is a solution selected from the group consisting of:

$H_2O_2$+$NH_4OH$+EDTA+deionized (DI) water; and
$H_2O_2$+$NH_4OH$+oxalic acid+DI water;

controlling an amount of the copper oxide layer remaining on the surface of the semiconductor wafer by controlling an amount of $H_2O_2$ in the cleaning chemical;

scrubbing the surface of the semiconductor wafer with a brush to remove between about 100 angstroms and about 150 angstroms of the copper oxide layer from the surface of the semiconductor wafer;

positioning the semiconductor wafer into a second brush box;

scrubbing the surface of the semiconductor wafer with a brush of the second brush box;

rinsing the semiconductor wafer and a brush of the second brush box with the cleaning chemical to remove any remaining copper from the surface of the wafer and the brush of the second brush box; and leaving the copper oxide layer having a thickness between about 5 angstroms and about 30 angstroms on the surface of the semiconductor wafer.

13. A method of treating a surface of a semiconductor wafer as recited in claim 12, wherein the cleaning chemical is applied to the semiconductor wafer and the brush of the second brush box for between about 3 seconds and about 10 seconds.

14. A method of treating a surface of a semiconductor wafer as recited in claim 12, wherein the surface of the semiconductor wafer and the brush of the second brush box are rinsed with deionized water to remove the cleaning chemical.

15. A method of treating a surface of a semiconductor wafer as recited in claim 14, wherein the $NH_4OH$ having a concentration of about 0.07 weight percent, and the $H_2O_2$ having a volumetric ratio relative to the deionized water of between about 1:30 and about 1:200.

* * * * *